TUNABLE HIGH-FREQUENCY APPARATUS

Filed June 7, 1956 2 Sheets-Sheet 1

INVENTORS:
CHARLES A. ARNOLD,
JAMES N. LIND,
BY Nathan J. Kornfeld
THEIR ATTORNEY.

TUNABLE HIGH-FREQUENCY APPARATUS

Filed June 7, 1956 2 Sheets-Sheet 2

INVENTORS:
CHARLES A. ARNOLD,
JAMES N. LIND,

BY Nathan J. Kompeed
THEIR ATTORNEY.

United States Patent Office 2,945,156

Patented July 12, 1960

2,945,156

TUNABLE HIGH-FREQUENCY APPARATUS

Charles Aloïs Arnold, Palo Alto, and James Norrell Lind, Los Altos, Calif., assignors to General Electric Company, a corporation of New York Filed June 7, 1956, Ser. No. 589,899

18 Claims. (Cl. 315—5.47)

Our invention relates, generally, to high-frequency apparatus and pertains, more particularly, to new and improved high-frequency electric discharge devices employing cavity resonators.

High-frequency electric discharge apparatus of the velocity modulation types are examples of high-frequency electric discharge devices wherein cavity resonators are sometimes employed which require variable or adjustable tuning to desired operating frequencies of the devices. Heretofore, various means have been proposed and resorted to for tuning such devices. For example, in the prior art are found various tuning arrangements wherein tuning is effected by varying the internal volumes and configurations of the cavities or by introducing conductive elements into the electrical and magnetic field regions of excited cavity resonators. Often, and for various reasons, it is desirable that the tuning means provided be adapted for affording a linear relationship between tuner positions and frequency variations over a substantial frequency band. However, this linear relationship is not generally obtainable with the prior art tuning arrangements. Those arrangements which do provide some linearity are often found inadequate in that the frequency bands over which linearity is obtained are not sufficiently wide or the arrangements are too complicated for practical application or commercial reproduction.

Additionally, some forms of high-frequency apparatus are constructed to include a plurality of cavity resonators, in which case it is generally necessary to tune each resonator. The resonators may be tuned individually; however, this has been found extremely tedious and time consuming. Individual tuning is particularly inappropriate where it is desired, for various purposes, to sweep tune or vary the frequency of multiple resonators over a substantial frequency band relatively quickly. Thus, it is often desirable to gang tune or simultaneously tune the various resonators either to substantially the same frequency or predetermined variations thereof. The prior art suggests a variety of means for gang tuning several cavity resonators. However, these have proved generally unsatisfactory as not being reliable in effecting "tracking" of the operating frequencies of the various resonators; i.e., in tuning the various resonators to substantially the same frequency or predetermined different frequencies simultaneously in accordance with predetermined displacement of common tuner actuating means.

Further, in some tuning arrangements disclosed by the prior art, gang-tuning is accomplished only at the expense of degradation of the tuning of one or more of the resonators. That is, in order to provide for simultaneous tuning of the resonators it has heretofore been necessary to tolerate some detuning or less than desired sharpness of resonance of one or more of the resonators.

The primary object of the present invention is to provide new and improved high-frequency velocity-modulation electron discharge device having cavity resonators and tuning means for said cavity resonators.

Another object of the present invention is to provide new and improved tuning means adapted for effecting a linear relationship between tuner positioning and frequency variations over a substantial frequency band.

Another object of the present invention is to provide a new and improved gang-tuning arrangement for high frequency apparatus employing multiple-cavity resonators.

Another object of the present invention is to provide a new and improved gang-tune arrangement adapted to gang-tune a plurality of cavity resonators so as to provide for satisfactory tracking of the operating frequencies of the resonator.

Another object of the present invention is to provide new and improved tuning means adapted for enabling simultaneous tuning of a plurality of cavity resonators in accordance with displacement of common tuner-actuating means.

Another object of the present invention is to provide new and improved gang-tuning means for multiple-cavity resonators including means enabling tuning of each resonator to a desired high degree of sharpness of resonance.

Another object of the present invention is to provide high-frequency apparatus tuning means which is relatively simple and inexpensive in construction and practical for commercial applications.

Further objects and advantages of the present invention will become apparent as the following description proceeds and the features of novelty which characterize our invention will be pointed out with particularity in the claims annexed to and forming part of this specification.

In carrying out the objects of our invention we provide an electric discharge device including a cavity resonator having a re-entrant pole providing a capacity gap. Disposed in the resonator and mounted in spaced relation about the re-entrant pole is an annular tuning vane adapted for being adjustably positionable relative to the pole. The tuning vane is adapted for having predetermined proportional capacitive and inductive effects on the electrical and magnetic fields, respectively, in the resonator at each adjustment position as to provide a linear relationship between frequency variations and adjustment positions of the vane throughout a substantial frequency tuning bandwidth. The device may include a plurality of cavity resonators each provided with one of the mentioned tuning vanes. In this type of construction the vanes are simultaneously, adjustably positionable by common actuating means for effecting gang tuning of the resonators with "tracking" of the operating frequencies of the indivdual resonators. Additionally, the vanes are individually, adjustably positionable for independently varying the tuning of each resonator obtained by gang-tuning.

For a better understanding of our invention, reference may be had to the drawing wherein.

Figure 1:
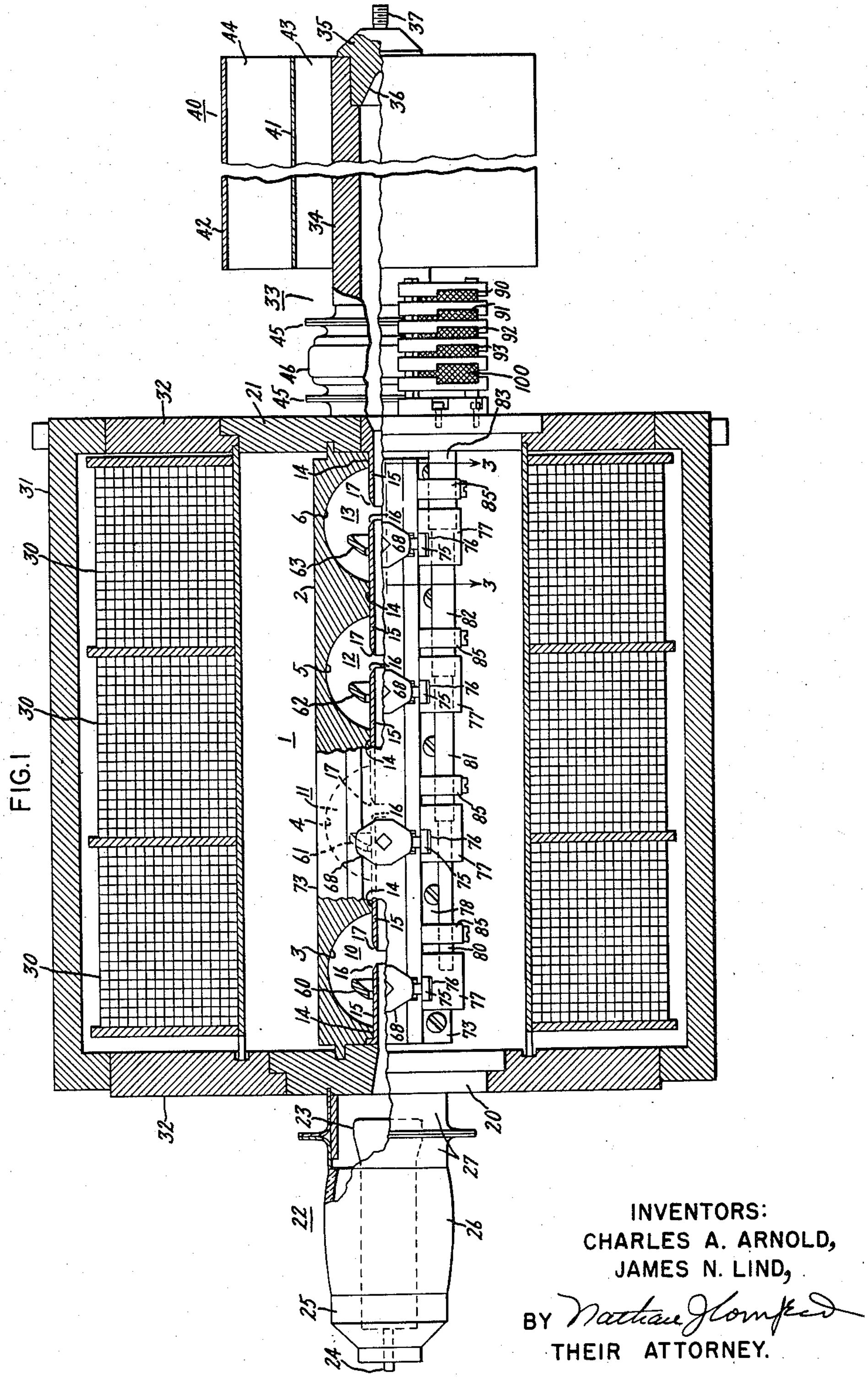
Figure 1 is a partially sectionalized elevational view of high-frequency apparatus incorporating an embodiment of the present invention.

Referring to the drawing there is shown in Figure 1 high-frequency apparatus including a high-frequency electric discharge device of the electron velocity modulation or klystron type employing multiple-cavity resonators and generally designated 1. From the outset it is to be understood that our invention is not limited to devices employing multiple-cavity resonators, or to klystrons of the amplifier or any other type, but is generally applicable to high-frequency apparatus employing one or more cavity resonators although at least one form of our invention is particularly applicable to apparatus including multiple-cavity resonators.

The device 1 includes a body 2 formed of a block of suitably conductive material, such as copper, and having bores 3, 4, 5 and 6. The bores 3–6 are diametrically aligned and the outer end of each is closed by a suitable conductive cap 7 in the manner seen in Figures 2 and 3.

The bores 3–6 form the tubular internal surfaces of four cavity resonators which hereinafter shall be referred to as the first, second, third and fourth resonators designated 10, 11, 12 and 13, respectively. The several resonators are interconnected by a bore 14 extending longitudinally through the body 2 and intersecting perpendicularly the longitudinal axes of the several bores 3–6. Suitably secured in the portions of the bore 14 extending between adjacent ones of the bores 3–6 and in the portions between the bores 3 and 6 and the ends of the body 2 are tubular elements 15 formed of any suitable conductive material, such as copper, and adapted for serving in the devices as a drift tube or structure provided for defining an electron-stream passage including substantially field-free regions. The opposed ends of adjacent ones of the elements 15 extend into corresponding ones of the bores 3–6 for constituting opposed re-entrant poles 16 and 17 of the cavity resonators and defining the capacity gaps thereof.

Secured, as by brazing, to the left-hand end of the body 2 in Figure 1 is a magnetic-material collar member 20 and similarly secured to the opposite end of the body is a similar collar member 21, the purposes for which will be understood from the following description.

Suitably sealed to the collar member 20 and axially aligned with the drift tube comprising the elements 15 is a cathode assembly generally designated 22. The cathode assembly 22 includes an electron-stream-producing means or emitter generally designated 23 and adapted for producing and directing a stream of electrons along a substantially linear path within the tubular elements 15. Operating current for the emitter 23 may be supplied through an axial stem member 24 and a coaxial annular contact 25 which are mutually electrically isolated in any suitable conventional manner. Additionally, the stem 24 and contact 25 may be electrically isolated from the body of the device by an annular insulative member 26. Sealing of the cathode assembly member 22 to the collar member 20 may be effected by one or more sealing rings 27 interposed between and suitably secured to the adjacent ends of the insulating member 26 and the collar 20.

In transit through the elements 15 the electrons in the electron stream provided by the emitter 23 are collimated magnetically. This may be accomplished in a conventional manner by means of a plurality of suitably energized electromagnetic coils 30 mounted externally of the body 2 in juxtaposed positions and coaxially with respect to the elements 15. The coils 30 may be supported by a frame 31 which, in turn, may be suitably supported by the collar members 20 and 21. The frame 31 includes annular magnetic-material pole pieces 32 which in cooperation with the collars 20 and 21 afford a predetermined desired extension of the external magnetic circuit.

Following transit through the tubular elements 15, or the drift tube of the device, the electrons comprising the stream of electrons are received in a collector assembly generally designated 33. The collector assembly 33 is suitably secured, as by conventional metallic bonds, to the collar member 21 and includes a metallic, elongated centrally bored member 34. The outermost end of the member 34 is closed by a plug 35 having a substantially conical inner surface 36. While the member 34 is adapted for absorbing most of the electrons received therein, a slight absorption occurs at the surface 36 of the plug 35. Provided on the outer end of the plug 35 is a threaded terminal 37 by means of which the collector assembly may be suitably grounded.

Absorption of the electrons by the collector assembly results in substantial heat generation therein which it is necessary to dissipate for satisfactory operation of the device. This dissipation may be effected in a variety of ways. In the structure illustrated a radiator 40 is provided which includes a pair of spaced concentric cylinders 41 and 42 interconnected by pluralities of circumferentially spaced thermally conductive radial fins 43 and 44.

The sealing and securing of the collector assembly 33 to the edge of the body 2 is effected by means including a plurality of metallic sealing rings 45 and an interpositioned annular insulative member 46. The member 46 is further effective for separating the respective currents of the body 2 and the collector assembly 33. The device 1 is evacuated and the various seals are necessarily such as to maintain the vacuum in the device.

Figures 2, 3:
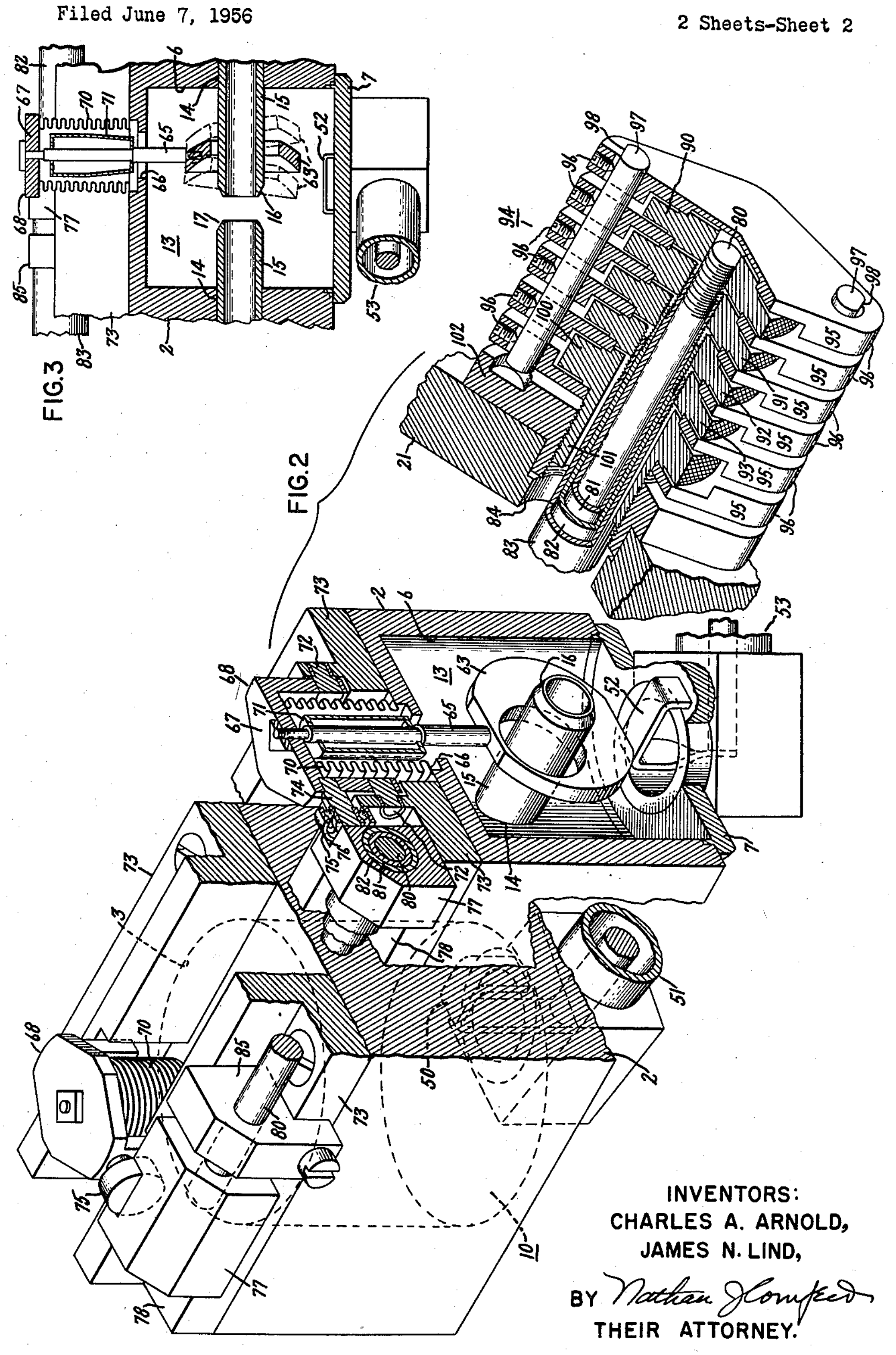
Figure 2 is an enlarged fragmentary partially sectionalized perspective illustration of the device of Figure 1.
Figure 3 is an enlarged fragmentary sectional view taken along the lines 3—3 in Figure 1 and looking in the direction of the arrows.

As seen in Figure 2, the first resonator 10 is provided with an energy input coupling loop 50. The loop 50 may be of conventional construction and connected to a coaxial transmission line 51 in any suitable manner for maintaining the vacuum in the device. The fourth resonator 13 is provided with an energy output coupling loop 52 which as shown, may be substantially identical to that provided for the first resonator and may be connected to a coaxial transmission line 53.

In the operation of the above-described device, the emitter 23 is energized in any suitable manner, as by connection to a battery (not shown). Thus, the emitter is rendered operative for directing a stream of electrons through the drift tube toward the collector assembly 33 in the above-referred-to manner. In a conventional manner the first resonator 10 is excited and caused to establish and maintain stationary electromagnetic waves therein as by coupling thereinto radio-frequency energy through the loop 50 from any input signal source (not shown). In a manner well-known in the art of high-frequency apparatus, this excitation of the first resonator 10 results in the input signal being impressed on the electron stream and effectively velocity modulating the components thereof. This velocity modulation of the components of the electron stream effects density modulation thereof in the field-free region or drift space provided by the element 15 extending between the first and second resonators. The density-modulated beam excites the second resonator 11 to the extent that the second resonator further modulates the velocity of components traveling across the capacity gap therein and toward the third resonator 12. The effect of the second resonator 11 on the electron components is repeated by the third resonator 12 whereby the density modulation is still further increased in transit toward the fourth resonator 13. The fourth resonator 13 is excited in accordance with the density modulation of the components of the stream at the gap between the re-entrant poles 16 and 17 therein. Thus, the input signal is amplified and in a conventional manner the amplified signal is extracted from the fourth resonator 13 by means of the output loop 52.

Tuning of the several resonators is effected by means including generally annular tuning members or vanes 60, 61, 62 and 63 disposed in the bores of the resonators 10, 11, 12 and 13, respectively. Each vane is formed of a suitable highly conductive and non-magnetic material, such as copper, and is by its annular configuration adapted for being mounted about and in spaced relation to one of the re-entrant poles 16 and 17 in its respective resonator. As seen in the drawing, in the present construction the vanes are mounted about the poles 16 extending into the resonator from the cathode-assembly side of the device. However, it will be understood that, if desired, the vanes could be mounted about the oppositely disposed poles and, in some constructions, vanes might be provided about both poles.

By means to be described in detail hereinafter the vanes 60, 61, 62 and 63 are each adapted for being adjustably positionable relative to the poles and cavity walls of the respective resonators substantially in the manner illustrated in Figure 3. In the device illustrated, the adjustable positioning and tuning effect of all the vanes are substantially identical. Thus, in order to simplify explanation of the tuning aspect of the invention, description of tuner positioning and the effect thereof will hereinafter be described with respect to only one resonator and, specifically, the fourth resonator 13 illustrated in detail in Figure 3. It will be understood, however, that the description of the operation of the tuner in the structure of Figure 3 is equally applicable to the tuners in the other resonators of the device.

When excited in a desired mode, the stronger or more concentrated portion of the electric field is present at and immediately adjacent the capacity gap therein and the stronger or more concentrated portion of the magnetic field is located adjacent the internal wall of the cavity. Also when the electric field in the cavity resonator is displaced by a conductive body a shift in resonator frequency results. This phenomenon may be viewed as a change in the capacity in the equivalent circuit or in the capacity of the gap between the opposed re-entrant poles 16 and 17. Additionally, an inductive tuning effect occurs when a conductive body is moved relative to the gap and cavity wall. This results from perturbation of the magnetic field and also effects a shift in the resonant frequency of the system.

In the present invention the vane 63 is adapted for displacing the electrical fields and perturbing the magnetic fields in the resonator 13 in such predetermined proportions at each adjustment position thereof as to effect a predetermined relationship between frequency variations and adjustment positions of the vanes. Specifically, the vane illustrated in the drawing is adapted for displacing electrical fields and perturbing magnetic fields in the resonator 13 at each adjustment position in proportions for effecting a linear relationship between the resultant frequency changes or variations and adjustment positions of the vane. This adaptation of the vane is attributed to the shape or configuration and volume thereof as well as the location of the vane relative to the various components of the resonator.

As perhaps may best be seen in Figures 2 and 3 of the drawing, the vane is generally annular and the central opening is sufficiently large to enable the vane to be mounted about or over the end of the re-entrant pole 16 in spaced relation thereto. Additionally, the vane is dish-shaped. The particular vane illustrated is formed as a section of a sphere and is thus arcuate in cross section. It has been found that the magnetic fields in the resonator are most greatly concentrated at the base of the re-entrant poles or where the poles and the internal walls of the resonators are contiguous. Thus, preferably, the outer spherical radius of the vane 63 is substantially the same as the radius of the bore 4 of the resonator in order thereby to enable the vane to be moved into a position of substantial conformance with the resonator wall and wherein it will be adapted for desired perturbing effects on the highly concentrated magnetic fields at the base of a re-entrant pole. Additionally, the spherical symmetry obtained between the vane and resonator wall results in a desired gradual change of perturbation of the fields during adjustment movements of the vane. The ends of the vane corresponding to the flat sides of the cavity are ground off or otherwise removed for presenting sides extending substantially parallel to the flat sides of the cavity.

At any adjustment position of the vane, such as that illustrated in solid lines in Figure 3, the vane displaces the electrical fields and perturbs the magnetic fields in the cavity, thus having capacitive and inductive tuning effects which in combination result in a substantially predetermined tuning effect on the resonator 11. When the vane is adjustably positioned closer to the gap between the poles 16 and 17, as when it is moved to the dot and dash line position indicated, it displaces electrical fields of greater concentration for capacitively effecting a shift to a lower resonant frequency. Concurrently, it perturbs magnetic fields of lesser concentration than at the solid line position, which has the inductive effect of decreasing the resonant frequency of the resonator. Due to the shape and volume of the vane these capacitive and inductive tuning effects are in such relative proportions that the frequency change resulting from the combined effects has a linear relationship to the amount of movement of the vane between the solid and dot and dash line positions illustrated. When the vane is adjustably positioned away from the gap, as when it is moved to the dash line position indicated, it perturbs magnetic fields adjacent the walls of the cavity which are of greater concentration than at either of the other described positions and thus inductively increases the resonant frequency of the resonator. In this position the vane also displaces electrical fields of lesser concentration than at the other positions with the result that capacitively the frequency is increased. Again, due to the shape and volume of the vane these capacitive and inductive tuning effects are so proportioned that the resultant frequency change at the dash line position has a linear relationship to the amount of movement of the vane between the solid and dash line positions illustrated and this relationship is co-linear with the relation described above with regard to the movement of the vane between solid line and dot and dash line position.

The shape and volume of the vane for obtaining the desired linearity in tuning has been obtained by empirical methods, that is, measurements were made to determine the relative magnitudes of the electrical and magnetic fields at various points in the cavity and the vane was correspondingly shaped and formed to a thickness for obtaining displacement and perturbation of such fields in desired proportions at each adjustment position of the vane. However, the desired configuration of the vane may be obtainable by equally effective, analytical and mathematical solutions. For example, after determining a configuration adapting the vane for conformance to the wall of the resonator at the base of the re-entrant pole, the desired perturbing volume at the vane may be approximated mathematically in a manner known in the art. A method that can be employed for such approximation is described in "Microwave Electronics," by J. C. Slater, published by Van Nostrand Company, Inc., New York, 1950. The volume thus determined may then be distributed in the vane in accordance with this invention for obtaining the desired proportional capacitive and inductive tuning.

A cavity resonator of a different configuration than that illustrated may dictate the employment of a vane of an irregular configuration other than that shown to obtain the desired proportional displacement of both the electrical and magnetic fields at each adjustment position thereof. For example, a cavity having a bore other than cylindrical might dictate the use of a vane which does not comprise a section of a sphere but which has another configuration adapting it for substantial conformance with the wall of the resonator at the base of the re-entrant pole thereby to afford desired perturbing effects on the magnetic fields concentrated about the base of the pole and to afford desired gradual change of perturbation of such fields when the vane is adjustably moved in respect thereto. Thus, from the foregoing it will be clear that regardless of cavity configuration if one commences with the surface of the vane adapted for conforming substantially with the cavity wall at the base, one may then empirically or graphically arrive at the required volume of the tuning member and the shapes of the other surfaces thereof.

Additionally, with some cavity configurations modifications of the linear tuning characteristic may be more readily obtained by slight modification of the spacing between the inner edge of the vane and the re-entrant pole, by providing for adjustment of the vane so that it may effectively bridge the capacity gap, by modifying the concave side of the vane in accordance with capacity-gap geometry and by varying the volume of the tuning vane. These modifications may be arrived at empirically or graphically, as described above. In terms of the previous explanation such modifications will be made with the purpose of displacing the electric fields between the pole pieces and perturbing the magnetic fields in the resonator in such balance or proportions at each adjustment position of the vane as to provide the desired linearity.

While the vane and its frequency changing effects have been illustrated and described in respect to only three different adjustment positions thereof, it is to be understood from the foregoing teaching that the vane is adapted for being adjustably positioned relative to the re-entrant poles at the positions shown or any intermediate positions. It is to be understood further from the foregoing that the dot-and-dash-line and the dash-line positions illustrated represent the extremes in adjustment positions and that movement of the vane between these extreme positions will accomplish tuning over a substantial frequency band which may be in the order of 15 percent and that such tuning will be characterized by a substantially linear relationship between frequency variations and adjustment positions of the vane throughout the tuning band width.

The tuning vanes 60–63 are each mounted in a respective cavity by a support rod 65. Each support rod 65 extends through the side wall of the body 2 through an elongated slot 66 formed therein and extending parallel to the axis of the device. Externally of the cavity, the extremity of each rod 65 is secured in the center or bight portion 67 of a substantially U-shaped yoke member 68 associated with each of the resonators 60–63. Sealed between the inner body 2 surrounding the slot 66 is a bellows structure 70. The bellows 70 is provided for enabling lateral adjustment movements of the rod 65 in the slot 66 while preserving the evacuated condition of the device. Provided in the bellows and mounted on and surrounding an intermediate portion of the rod 65 is a cylindrical member 71 adapted for avoiding any substantial undesired distortions of the fields in the cavity.

Fitted in the lower ends of the leg portions of the yoke 68 are outwardly extending lugs 72 (Figure 2) which are suitably journalled between a spaced pair of elongated angle bars 73 which are suitably secured to the body 2 and extend in parallel relation to the axis thereof. This arrangement enables the yoke member 68 to be rocked about the axis of the lugs 72 thereby to provide the adjustment movements of the vane carried by the support rod 65. The means for providing the rocking of the yoke member associated with each resonator includes a stud 74 extending from one side thereof and carrying a roller bearing structure including a race 75. The race 75 is positioned in a recess 76 formed in the edge of a block 77 associated with each resonator and adapted for being slidable longitudinally of the body 2 on a surface 78 on one of the angle bars 73. In accordance with the sliding movement of a block 77 the associated yoke 68 is rocked for effecting adjustment movements of the corresponding vane in the respective cavity.

As will be clear from the drawing and the foregoing description, a vane positioning structure including a rod 65, yoke 68 and block 77 is provided for each of the resonators for adjustably positioning the tuning vane therein. Provided for actuating the blocks 77 are four actuating members or shafts 80, 81, 82 and 83 which are preferably arranged concentrically and adapted for being slidably movable relative to each other. The shafts extend through an aperture 84 in the collar 21 and are suitably rotatably mounted on the device by means of spaced brackets 85 secured to the bar 73 including the guide surface 78.

The shaft 80 is connected to the block 77 associated with the first resonator 10 and extends through the other shafts and blocks. The shaft 81 is connected to the block 77 associated with the second cavity 11 and extends slidably through shafts 82 and 83 and the blocks associated with the third and fourth cavities 12 and 13, respectively. The shaft 83 is connected to the block 77 associated with the fourth cavity 13 and extends through shaft 83 and the block 77 associated with the fourth cavity 13, and the block 77 of the fourth cavity 13 has the largest shaft 83 connected thereto.

On the outer side of the collar 21 the shafts 80, 81, 82 and 83 are of progressively decreasing length and the ends thereof are threaded for cooperating with internally threaded knurled knobs 90, 91, 92 and 93, respectively. The knobs 90–93 are captivated in a movable carriage generally designated 94 and including a plurality of spacers 95 which are secured by means of set screws 96 in suitable spaced relation on a pair of rods 97 including flat sides 98 for cooperating with the set screws. Additionally, the carriage includes a centrally bored knurled kob 100 including a cylindrical portion 101. The knob 100 is spacedly fitted over the concentric shafts between the collar 21 and the other knobs and is held in the carriage by one of the spacers 95 on the rods 97. The portion 101 of the knob 100 is externally threaded for cooperating with an internally threaded member 102 mounted stationarily on the collar 21. In this arrangement turning of the knob 100 actuates the carriage 94 longitudinally whereby all of the shafts 80 through 83 are actuated longitudinally simultaneously or in unison. Rotation of the individual knobs provides sliding longitudinal actuation of the individual shafts with respect to each other and independently of the actuation resulting from movement of the carriage.

In operation of the device, the tuning members or vanes 60 through 63 are adapted, for example, to effect tuning over a frequency range of 2500 to 2700 mc./sec., or any similar desired band width and gang tuning of the several resonators can be accomplished by turning the knob 100 whereby the carriage 94 is actuated. This actuation of the carriage causes the captivated knobs 90 through 93 on the individual shafts to actuate all of the shafts 80 through 83 amounts equal to the travel of the carriage. Thus, the blocks 77 are concomitantly moved equal amounts which effects equal rocking movements of related yoke members 68 and corresponding equal movements of the tuning vanes 60 through 63 associated with the yoke member. This concomitant equal movement of the tuning vanes and the above-described common linear relation between frequency variations and tuning positions of the vanes provided for tracking of the various resonant circuits or simultaneous tuning of the several resonators to substantially the same frequency as the single adjustment knob 100 is turned. Additionally, the described structure enables rapid sweep gang-tuning of the several resonators over the complete frequency tuning band.

Due to unavoidable manufacturing tolerances it is sometimes the case that the gang-tuned position of one or more of the tuning vanes 60–63 may not provide the desired sharpness of resonance of respective resonators. When this is the case, the individual vanes can be further adjustably positioned independently and simply by turning the respective ones of the adjustment knobs 90–93. It will be clear from the above teaching that the individual adjustment knobs 90–93 can be operated for effecting independent variations of the gang tuning of the several resonators for any desired operational purpose.

Thus, in the present structure gang-tuning of the various resonators can be simply and quickly accomplished by turning the knob 100 while individual adjustments of the tuning of each resonator obtained by gang-tuning can be accomplished simply and quickly by turning the associated independently operable knobs 90–93.

It will be seen further from the present teaching that while our invention has been illustrated and described as pertaining to a tuning arrangement adapted for tuning the resonators simultaneously to the same general frequency, it is equally applicable where it is desired that the resonators be tuned simultaneously to any predetermined frequencies, whether they be the same or not.

It will be seen still further from the foregoing that the vanes 60–63 are not limited in application to devices employing multiple cavities but any one thereof may be suitably employed in a single cavity device, such as a reflex klystron, where it is desirable that a linear relationship exists between the frequency variations and adjustment positions of the tuner.

While we have shown and described a specific embodiment of our invention, we do not desire our invention to be limited to the particular form shown and described, and we intend by the appended claims to cover all modifications within the spirit and scope of our invention.

What we claim as new and desire to secure by Letters Patent of the United States is:

1. In high-frequency apparatus, a cavity resonator, tuning means for said cavity resonator including a tuning member wholly included within the cavity of said cavity resonator and means for adjustably positioning said tuning member in said resonator, said tuning means having a dish shape for affecting the frequency of said resonator at each adjustment position thereof for effecting a substantially linear relationship between frequency variations and adjustment positions of said tuning means.

2. In a high-frequency apparatus, a cavity resonator including means providing a capacity gap, a tuning member disposed wholly within the cavity of said resonator and adjustably positionable relative to said gap, said member having a surface adapted for substantial conformance with a wall of said resonator and including portions effective for displacing the electrical and magnetic fields in said resonator in predetermined proportions at each adjustment position of said member for effecting a substantially linear relationship between frequency variations and adjustment positions of said member.

3. In high-frequency apparatus, a cavity resonator including a re-entrant pole and provided with an aperture through one wall thereof, an annular tuning member, and suspension means extending through the aperture in said one wall and having one end fixed to said annular member, said suspension means mounted for pivoting motion relative to said one wall and positioning said annular member in spaced relation about said pole and out of contact with the interior surface of the cavity of said resonator, and means for pivoting said suspension means whereby said annular member is moved relative to said pole for effecting the varying tuning of said resonator, said annular member having a shape providing a substantially linear relationship between frequency variations and adjustment positions of said member.

4. In high-frequency apparatus, a cavity resonator including a re-entrant pole, a vane mounted about said pole and out of contact therewith and being adjustably positionable relative thereto for effecting variable tuning of said resonator, and said vane having a substantially dish shape for displacing both electrical and magnetic fields in said resonator at each adjustment position in proportions for effecting a substantially linear relationship between frequency variations and adjustment positions of said vane.

5. In high-frequency apparatus, a substantially cylindrical cavity resonator including a re-entrant pole, a vane mounted wholly within the cavity of said resonator in spaced relation about said pole and out of contact with the interior surface of said cavity, said vane being adjustably positionable relative thereto for effecting variable tuning of said resonator, and said vane comprising a section of a sphere whereby said vane is adapted for substantial conformance with the wall of said resonator, said vane having inductive and capacitive tuning effects in proportions at each adjustment position for effecting a substantially linear relationship between frequency variations and adjustment positions of said vane.

6. A high-frequency electric discharge device of the electron velocity-modulation type comprising; an envelope including means defining a cavity resonator having a gap therein, means to produce and direct an electron stream through said resonator and across said gap, said resonator being adapted to effect velocity modulation of the electrons comprising said stream, tuning means including a tuning member mounted wholly within the cavity of said resonator and out of contact with the interior surface of said cavity, and means for adjustably positioning said tuning member in said resonator, said tuning means having a shape for affecting the frequency of said resonator at each adjustment position thereof for effecting a substantially linear relationship between frequency variations and adjustment positions of said tuning means.

7. A high-frequency electric discharge device of the electron velocity-modulation type comprising; an envelope including means defining a plurality of cavity resonators arranged along a path and having re-entrant pole means defining gaps therein, means to produce and direct an electron stream along said path, said resonators being adapted to effect velocity modulation of the electrons comprising said stream, a plurality of suspension members extending each into one of said resonators and mounted for rocking motion relative thereto, a corresponding plurality of annular tuning members each mounted on the suspension member and positioned about said pole in its respective cavity, said tuning members having a shape for affecting the frequency of said resonators at each adjustment position thereof for effecting a substantially linear relationship between frequency variations and adjustment positions of said tuning means, common means for rocking said suspension members thereby adjustably positioning said tuning members simultaneously in said resonators, and means associated with at least one of said members for rocking the corresponding suspension member thereby varying adjustments thereof affected by said common means.

8. In high-frequency apparatus, a plurality of cavity resonators, a plurality of tuning members extending each into one of said resonators, said tuning members having a shape for affecting the frequency of said resonators at each adjustment position thereof for effecting a substantial linear relationship between frequency variations and adjustment positions of said tuning means, common means for adjustably positioning said tuning members simultaneously in said resonators, and means associated with at least one of said members for varying adjustments thereof effected by said common means.

9. In high-frequency apparatus, a plurality of cavity resonators each having a re-entrant pole means defining gaps therein, a plurality of tuning members each positioned within one of said resonators surrounding said pole means, a plurality of suspension members each extending into one of said resonators and supporting the said tuning member therein, each said suspension member extending out one wall of the cavity and mounted thereon for rocking motion, common actuating means for producing rocking movement of said suspension means thereby to adjustably position said tuning members simultaneously in said resonators, and individual actuating means associated with each of said suspension means and operative independently of said common means for varying adjustments made in the positions in each of said tuning members with said common means.

10. In high-frequency apparatus, a plurality of cavity resonators, a tuning member disposed within each of said resonators and out of contact with the interior surface thereof, suspension means holding said tuning member in position and mounted for rocking motion in one wall of said cavity resonator, a plurality of actuating members each associated with one of said tuning members and operative for independently rocking a respective suspension means and thereby moving a respective tuning member, and means for simultaneously actuating said plurality of actuating members in like manner thereby to effect gang tuning of said resonators.

11. In high-frequency apparatus, a plurality of cavity resonators, a plurality of tuning members each associated with one of said resonators, suspension means holding said tuning members in position within its associated resonator and mounted on one wall of each said resonator for rocking motion relative thereto, a plurality of concentric actuators each coupled with only one of said tuning members through its associated suspension means, means for adjustably positioning said plurality of actuators in unison for producing a rocking motion of said suspension means thereby gang tuning said resonators, and means for independently adjustably positioning each of said actuators for producing a corresponding independent adjustment on each side suspension means therefore varying said gang tuning.

12. In high-frequency apparatus, a plurality of cavity resonators, a plurality of tuning members each extending into one of said resonators, independent suspension means each holding an individual tuning member in position in its resonator and mounted on one wall of said resonator for rocking motion relative thereto, a plurality of concentric shafts longitudinally slidable with respect to each other and each connected with one of said suspension means, means for concomitantly longitudinally actuating said shafts for simultaneously rocking each of said suspension means thereby gang tuning said resonators, and means for independently longitudinally actuating each of said shafts relative to the others for varying said gang tuning.

13. In high-frequency apparatus, a plurality of cavity resonators, a plurality of individual suspension means each extending into a cavity resonator and mounted on one wall thereof for rocking motion relative thereto, a plurality of tuning members each mounted on one of said suspension means whereby each of said tuning members is adjustably positionable in one of said resonators in response to adjustment of position of its respective suspension means, said tuning members adapted for effecting a substantially linear relationship between frequency variations and adjustment positions thereof, means adjustably positioning said individual suspension means and thereby tuning members concomitantly to effect substantially tracked gang tuning of said resonators, and means associated with at least one of said individual suspension means for varying adjustments made thereto with said first-mentioned means.

14. In high-frequency apparatus, a plurality of cavity resonators each including a re-entrant pole, a suspension means extending into each cavity resonator and mounted on one wall thereof for rocking motion relative thereto, a tuning member mounted on each of said suspension means and thereby held in each of said resonators in spaced relation about the pole thereof, each said member being adjustably positionable relative to said pole in response to adjustment of the position of its respective suspension means for effecting tuning of said resonators, common actuating means for simultaneously adjustably positioning said suspension means thereby to simultaneously adjustably position said members in said resonators, and individual actuating means associated with each of said tuning members and operative independently of said common means for varying adjustments made to the positions of each of said members with said common means.

15. In high-frequency apparatus, a plurality of cavity resonators, each including a re-entrant pole, a plurality of individual suspension means each extending into one of said cavity resonators and mounted on one wall thereof for rocking motion relative thereto, an annular vane mounted on each of said suspension means and thereby positioned in each of said resonators about the pole thereof, said annular vane being adjustably positionable relative to said pole in response to movement of its respective suspension means for effecting tuning of the respective resonator, a plurality of actuating members each associated with one of said suspension means and operative for independently tuning the respective resonator, and means for simultaneously actuating said plurality of actuating members thereby to effect gang tuning of said resonators.

16. In high-frequency apparatus, a plurality of cavity resonators each including a re-entrant pole, an annular vane mounted about each of said poles and being adjustably positionable relative thereto, said vane being shaped in cross-section for causing inductive and capacitive tuning effects at each adjustment position thereof which are in proportions for effecting a substantially linear relation between frequency variations and adjustment positions of said vane, a plurality of concentric actuators each associated with only one of said vanes, means for adjustably positioning said plurality of actuators in unison for gang tuning said resonators, and means for independently adjustably positioning each of said actuators for varying said gang tuning.

17. In high-frequency apparatus, a plurality of cavity resonators, a plurality of tuning members each being adjustably positionable in one of said resonators and adapted for effecting a substantially linear relationship between frequency variations and adjustment positions thereof, a plurality of concentric shafts longitudinally slidable with respect to each other and each being connected with one of said tuning members, means for concomitantly longitudinally actuating said shafts for gang tuning said resonators, and means for independently longitudinally actuating each of said shafts relative to the other for varying said gang tuning.

18. In high-frequency apparatus, a plurality of cavity resonators, each including a re-entrant pole, a plurality of suspension means each mounted on one wall of a different one of said cavity resonators for rocking motion relative thereto, a vane fixed to each said suspension means and held in spaced relation about said pole whereby said vane is adjustably positionable relative thereto for effecting variable tuning of the respective resonator, said vane comprising a section of a sphere whereby the inductive and capacitive tuning effects thereof at each adjustment position are in proportions for effecting a substantially linear relation between frequency variations and adjustment positions of said vane, a plurality of concentric shafts longitudinally slidable with respect to each other and connected with one of said suspension means, means for concomitantly longitudinally actuating said shafts for simultaneously rocking said suspension means thereby gang tuning said resonators, and means for independently longitudinally actuating each of said shafts relative to the others for independently rocking said suspension means thereby varying said gang tuning.

(References on following page)

References Cited in the file of this patent

UNITED STATES PATENTS

| | | |
|---|---|---|
| 1,582,555 | Stoekle | Apr. 27, 1926 |
| 2,432,571 | Haeff | Dec. 16, 1947 |
| 2,439,831 | Varian et al. | Apr. 20, 1948 |
| 2,446,017 | McArthur et al. | July 27, 1948 |
| 2,462,866 | Hotine | Mar. 1, 1949 |
| 2,463,519 | Cooke et al. | Mar. 8, 1949 |
| 2,468,655 | Cole et al. | Apr. 26, 1949 |
| 2,501,534 | Nergaard | Mar. 21, 1950 |
| 2,505,572 | Overacker | Apr. 25, 1950 |
| 2,506,955 | Fracassi | May 9, 1950 |
| 2,512,901 | Litton | June 27, 1950 |
| 2,529,950 | Kather | Nov. 14, 1950 |
| 2,533,741 | Okress | Dec. 12, 1950 |
| 2,568,325 | Diamond | Sept. 18, 1951 |
| 2,853,647 | Litton | Sept. 23, 1958 |